(12) United States Patent
Yeom (10) Patent No.: US 8,704,284 B2
(45) Date of Patent: Apr. 22, 2014

(54) SEMICONDUCTOR DEVICE HAVING BIT LINE EXPANDING ISLANDS

(75) Inventor: Kye-hee Yeom, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 492 days.

(21) Appl. No.: 12/712,860

(22) Filed: Feb. 25, 2010

(65) Prior Publication Data

US 2010/0295130 A1   Nov. 25, 2010

(30) Foreign Application Priority Data

May 22, 2009   (KR) .......................... 10-2009-0045204

(51) Int. Cl.
*H01L 27/108* (2006.01)
*H01L 29/94* (2006.01)

(52) U.S. Cl.
USPC .... 257/301; 257/774; 257/906; 257/E21.657; 257/E21.658; 438/637; 438/667; 438/669; 438/672; 438/675

(58) Field of Classification Search
USPC .................. 257/301, 774, 906, 907, E21.648, 257/E21.657, E21.658; 438/637, 667, 669, 438/672, 675
See application file for complete search history.

(56) References Cited

U.S. PATENT DOCUMENTS

| 7,323,379 B2 | 1/2008 | Sinitsky et al. |
| 2005/0167718 A1 * | 8/2005 | Ema ............................ 257/301 |

FOREIGN PATENT DOCUMENTS

| KR | 1020030087744 A | 11/2003 |
| KR | 1020080029281 A | 4/2008 |

* cited by examiner

*Primary Examiner* — Meiya Li
(74) *Attorney, Agent, or Firm* — Myers Bigel Sibley & Sajovec P.A (57) ABSTRACT

Provided is a semiconductor device having bit line expanding islands, which are formed underneath bit lines to reliably expand and connect the bit lines. The semiconductor device includes: a semiconductor layer in which an isolation region and an active region are defined; an insulating layer, which is formed on the semiconductor layer; a plurality of bit lines, which are formed on the insulating layer; and one or more bit line expanding islands, which are formed inside the insulating layer and are electrically connected to a lower portion of at least one of the plurality of bit lines

8 Claims, 7 Drawing Sheets

SEMICONDUCTOR DEVICE HAVING BIT LINE EXPANDING ISLANDS

CROSS-REFERENCE TO RELATED APPLICATION

This application claims the benefit of Korean Patent Application No. 10-2009-0045204, filed on May 22, 2009, in the Korean Intellectual Property Office, the disclosure of which is incorporated herein in its entirety by reference.

BACKGROUND

The inventive subject matter relates to semiconductor devices, and more particularly, to semiconductor devices having bit line expanding islands capable of reliably expanding and connecting bit lines.

With the rapid increase in the integration of semiconductor devices and the rapid decrease in a design rule of semiconductor devices, it has been important to secure sufficient process margins of bit lines. Although a plurality of bit lines are generally expanded in parallel to have the same widths, taps having wider widths than other regions of the plurality of bit lines may be further formed. However, because the taps are formed on the same layer as the plurality of bit lines, the taps may possibly obstruct the uniform formation of the plurality of bit lines.

SUMMARY

According to an aspect of the inventive subject matter, there is provided a semiconductor device having bit line expanding islands, including: a semiconductor layer in which an isolation region and an active region are defined; an insulating layer, which is formed on the semiconductor layer; a plurality of bit lines, which are formed on the insulating layer; and one or more bit line expanding islands, which are formed inside the insulating layer and are electrically connected to a lower portion of at least one of the plurality of bit lines.

The plurality of bit lines may have equal widths, keep a first distance from one another, and may be expanded in a first direction.

The bit line expanding islands may electrically connect at least two of the plurality of bit lines to each other. The plurality of bit lines may be expanded in the first direction, and the bit line expanding islands may be expanded in a second direction crossing the first direction.

The bit line expanding islands and the plurality of bit lines may comprise a same material or may comprise different materials.

The bit line expanding islands may be disposed on the active region of the semiconductor layer to be electrically connected to the active region. The bit line expanding islands may be disposed on the isolation region of the semiconductor layer and may be electrically insulated from the semiconductor layer disposed underneath the isolation region. The bit line expanding islands may be disposed on gate structures formed on the active region of the semiconductor layer or on gate structures formed on the isolation region and electrically insulated from the gate structures.

According to another aspect of the inventive subject matter, there is provided a semiconductor device having bit line expanding islands, including: a semiconductor layer; an insulating layer, which is formed on the semiconductor layer; a plurality of first bit lines, which are formed on the insulating layer and keep a first distance from one another; a plurality of second bit lines, which are formed on the insulating layer, disposed among the plurality of first bit lines, keep a second distance from one another, and keep a third distance from the plurality of first bit lines, wherein the third distance is less than the first and second distances; and a plurality of bit line expanding islands, which are formed in a portion of the insulating layer, each of which is disposed underneath a lower portion of one of the plurality of first bit lines and a lower portion of one of the plurality of second bit lines, and which electrically connect the plurality of first bit lines to the plurality of second bit lines.

According to another aspect of the inventive subject matter, there is provided a semiconductor device having bit line expanding islands, including: a semiconductor layer in which a first cell region, a peripheral region, and a second cell region are defined; an insulating layer, which is formed on the semiconductor layer; a plurality of third bit lines, which are formed on the insulating layer and span at least portions of the first cell region and the peripheral region and keep a fourth distance from one another; a plurality of fourth bit lines, which are formed on the insulating layer and span at least a portion of the second cell region and keep a fifth distance from one another; and a plurality of bit line expanding islands, which are formed in a portion of the insulating layer, each of which is disposed underneath a lower portion of one of the plurality of third bit lines and a lower portion of one of the plurality of fourth bit lines, and which electrically connect the plurality of third bit lines to the plurality of fourth bit lines.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION OF THE EMBODIMENTS

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout the specification. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative tetras are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below, The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, the exemplary embodiments of the inventive subject matter will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

Hereinafter, the term "substantially" means an inclusion of an allowed tolerance, and the recitation "electrically connecting" means that elements connected to one another have electric conductivities among them. The recitation "electrically connecting" includes al cases of electrical connections including embodiments where elements are connected to one another through direct contact and embodiments where elements are connected to one another via one or more intervening elements.

Figure 1:
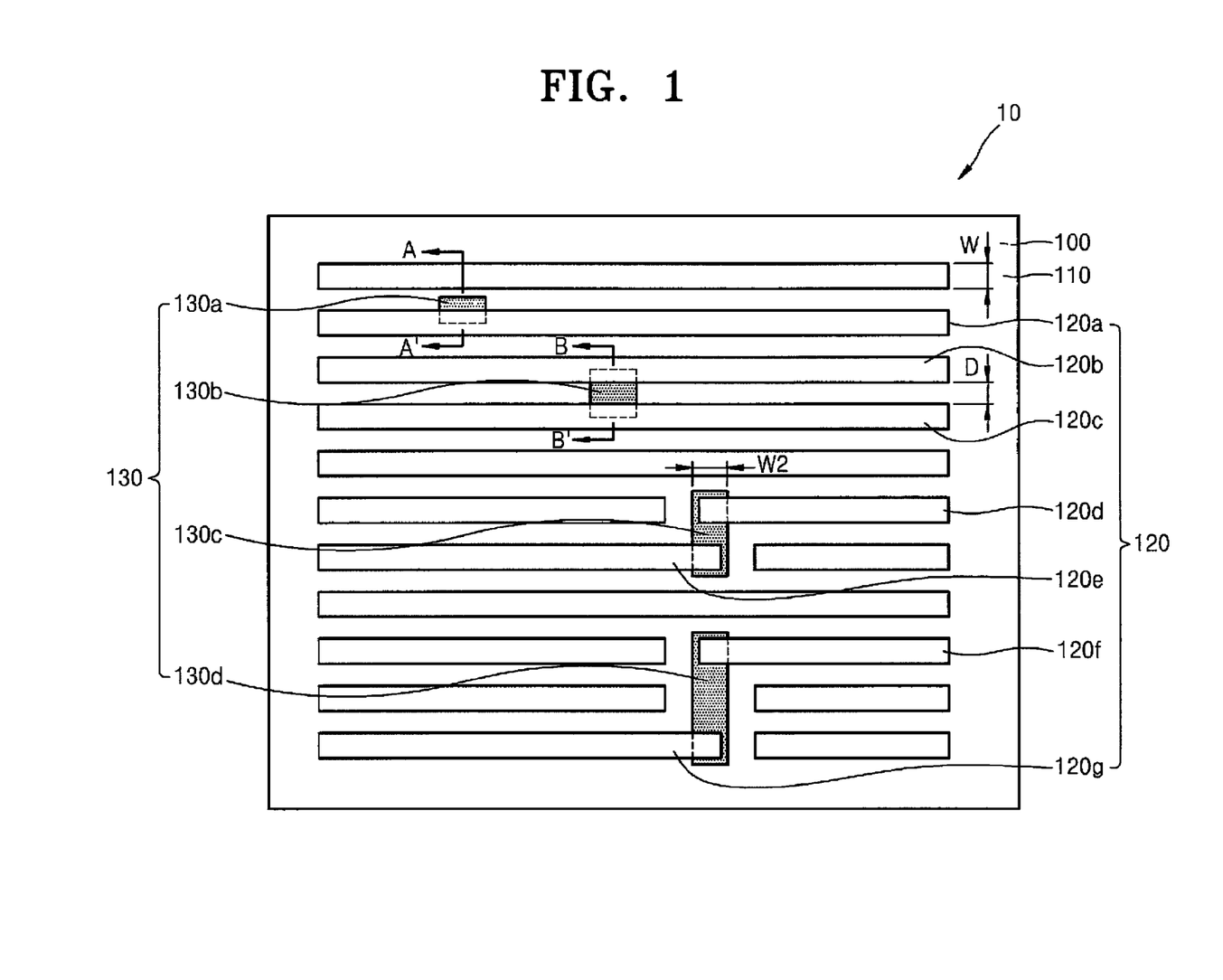
FIG. 1 is a plan view of a semiconductor device having bit line expanding islands according to some embodiments of the inventive subject matter.

FIG. 1 is a plan view of a semiconductor device 10 having bit line expanding islands 130 according to some embodiments of the inventive subject matter.

Referring to FIG. 1, the semiconductor device 10 includes a semiconductor layer 100, an insulating layer 110, which is formed on the semiconductor layer 100, a plurality of bit lines 120, which are formed on the insulating layer 110, and one or more bit line expanding islands 130, which are formed inside the insulating layer 110 and electrically connected to at least one of the plurality of bit lines 120. The bit line expanding islands 130 are electrically connected to lower portions of the plurality of bit lines 120 as marked with dotted lines; this will be described in more detail below.

The semiconductor layer 100 may include a substrate including a semiconductor material, such as silicon, silicon-germanium, or the like, an epitaxial layer, a silicon-on-insulator (SOI) layer, and/or a semiconductor-on-insulator (SEOI) layer, and the like. An isolation region 102 and an active region 104 as shown in FIGS. 2A through 3D may be defined in the semiconductor layer 100.

The insulating layer 110 may include oxide, nitride, or oxynitride, e.g., silicon oxide, silicon nitride, or silicon oxynitride. The insulating layer 110 may be formed using various methods, such as thermal oxidization, rapid thermal oxidation (RTO), chemical vapor deposition (CVD), plasma enhanced CVD (PECVD), high density plasma CVD (HDP-CVD), sputtering, atomic layer deposition (ALD), and the like. As will be described below, the insulating layer 110 may include gate structures 140 as shown in FIGS. 2B, 2D, 3B, and 3D.

The plurality of bit lines 120 each have a width "W," keep a distance "D" from one another, and are expanded in parallel in a first direction. The plurality of bit lines 120 may substantially have the same widths and may substantially keep the same distance from one another. Each of the plurality of bit lines 120 may have a wholly uniform width along its expanding direction. The plurality of bit lines 120 may each include a conductive material, e.g., polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), plumbum (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), or a combination thereof. The polysilicon may be doped with n-type impurities or p-type impurities. The plurality of bit lines 120 may each include silicide or nitride, e.g., titanium nitride (TiN), tungsten nitride (WN), tantalum nitride (TaN), titanium silicon nitride (TiSiN), tantalum silicon nitride (TaSiN), tungsten silicon nitride (WSiN), or a combination thereof. Each of the plurality of bit lines 120 may be a multiple layer formed of titanium/titanium nitride (Ti/TiN), tungsten/tungsten nitride (W/WN), or tantalum/tantalum nitride (Ta/TaN). However, the above-mentioned materials and structures of the plurality of bit lines 120 are exemplary, and the inventive subject matter is not limited thereto.

A described above, the bit line expanding islands 130 are formed inside the insulating layer 110 and electrically connected to a lower portion of at least one of the plurality of bit lines 120. The bit line expanding islands 130 may each include a conductive material, e.g., polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), plumbum (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), or a combination thereof. The polysilicon may be doped with n-type impurities or p-type impurities. The bit line expanding islands 130 may each include silicide or nitride, e.g., titanium nitride (TiN), tungsten nitride (WN), tantalum nitride (TaN), titanium silicon nitride (TiSiN), tantalum silicon nitride (TaSiN), tungsten silicon nitride (WSiN), or a combination thereof. Each of the bit line expanding islands 130 may be a multiple layer formed of titanium/titanium nitride (Ti/TiN), tungsten/tungsten nitride (W/WN), or tantalum/tantalum nitride (Ta/TaN). However, the above-mentioned materials and structures of the bit line expanding islands 130 are exemplary, and the inventive subject matter is not limited thereto. The plurality of bit lines 120 and the bit line expanding islands 130 may include the same type of materials or different types of materials.

The bit line expanding islands 130 may expand regions of the plurality of bit lines 120 which are electrically connected to the semiconductor layer 100 and increase overlap margins of the plurality of bit lines 120. Thus, the bit line expanding islands 130 may prevent or reduce the likelihood of imperfect electrical connections or short-cuts and thus can improve reliability of the semiconductor device 10. Because the plurality of bit lines 120 have substantially the same widths and keep substantially the same distance from one another, the plurality of bit lines 120 may reduce defects in a photolithographic process, an etching process, and the like. As a result, the plurality of bit lines can improve the reliability of the semiconductor device 10.

Hereinafter, exemplary connection structures for electrically connecting the bit line expanding islands 130 to the plurality of bit lines 120 will now be described in detail. The semiconductor device 10 may include at least one or all of the connection structures. For the descriptions of the connection structures, the plurality of bit lines 120 are classified into first through seventh bit line patterns 120a through 120g, and the bit line expanding islands 130 are classified into first through fourth bit line expanding island patterns 130a through 130d.

The first bit line expanding island pattern 130a is electrically connected to one of the plurality of bit lines 120, i.e., the first bit line pattern 120a. An overlap margin of the first bit line pattern 120a may be increased by the first bit line expanding island pattern 130a. The first bit line expanding island pattern 130a will be described in more detail below with reference to FIGS. 2A and 2B.

The second bit line expanding island pattern 130b is electrically connected to the bit lines 120, which are expanded parallel with each other and adjacent to each other, i.e., the second and third bit line patterns 120b and 120c. Thus, the second and third bit line patterns 120b and 120c are electrically connected to each other through the second bit line expanding island pattern 130b. Here, regions of the second and third bit line patterns 120b and 120c, which are connected to each other through the second bit line expanding island pattern 130b, are disposed in middle portions of the second and third bit line patterns 120b and 120c, and each of the second and third bit line patterns 120b and 120c is expanded in both directions. Overlap margins of the second and third bit line patterns 120b and 120c may be increased by the second bit line expanding island pattern 130b. The second bit line expanding island pattern 130b will be described in more detail later with reference to FIGS. 3A and 3B.

The third bit line expanding island pattern 130c is electrically connected to two adjacent ones of the plurality of bit lines 120, i.e., the fourth and fifth bit line patterns 120d and 120e. Thus, the fourth and fifth bit line patterns 120d and 120e are electrically connected to each other through the third bit line expanding island pattern 130c. Unlike the second bit line expanding island pattern 130b, the third bit line expanding island pattern 130c is connected to end portions of the fourth and fifth bit line patterns 120d and 120e. The fourth and fifth bit line patterns 120d and 120e are expanded from the third bit line expanding island pattern 130c along a first direction, being opposite each other, and the third bit line expanding island pattern 130c expands in a second direction crossing the first direction. The third bit line expanding island pattern 130c protrudes from the end portions of the fourth and fifth bit line patterns 120d and 120e; however, this is exemplary, and the inventive subject matter is not limited thereto. A width "W2" of the third bit line expanding island pattern 130e may be substantially equal to, greater than, or less than a width "W1" of each of the fourth and fifth bit line patterns 120d and 120e. The first and second directions are shown to vertically cross each other; however, this is exemplary, and the inventive subject matter is not limited thereto.

The fourth bit line expanding island pattern 130d is electrically connected to two spaced ones of the plurality of bit lines 120, i.e., the sixth and seventh bit line patterns 120f and 120g. Thus, the sixth and seventh bit line patterns 120f and 120g are electrically connected to each other through the fourth bit line expanding island pattern 130d. One or more bit line patterns are disposed between the sixth and seventh bit line patterns 120f and 120g; however, this is exemplary, and the inventive subject matter is not limited thereto. The fourth bit line expanding island pattern 130d may have characteristic features similar to that of the third bit line expanding island pattern 130c, and, thus, repeated descriptions will be omitted.

FIGS. 2A through 2D are cross-sectional views of the semiconductor device 10 taken along a line A-A' of FIG. 1, and FIGS. 3A through 3D are cross-sectional views of the semiconductor device 10 taken along a line B-B' of FIG. 1. Referring to FIGS. 2A, 2B, 3A, and 3B, the first or second bit line expanding island pattern 130a or 130b is disposed on the active region 104 of the semiconductor layer 100. Referring to FIGS. 2C, 2D, 3C, and 3D, the first or second bit line expanding island pattern 130a or 130b is disposed on the isolation region 102 of the semiconductor layer 100.

Figure 2A:
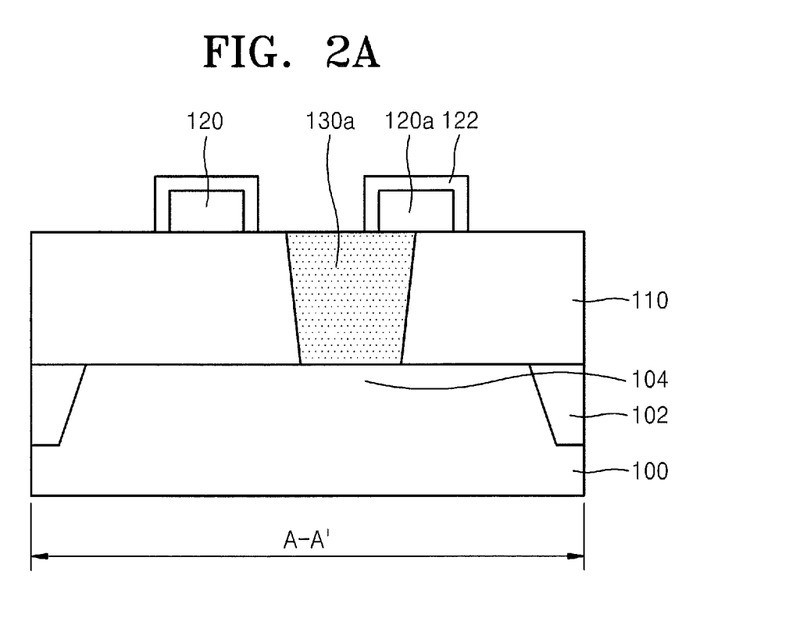
FIGS. 2A through 2D are cross-sectional views of the semiconductor device taken along a line A-A' of FIG. 1, according to some embodiments of the inventive subject matter.

Referring to FIG. 2A, the semiconductor layer 100 includes the isolation region 102, the active region 104, and the insulating layer 110 formed on the isolation region 102 and the active region 104. The isolation region 102 may include oxide, nitride, or oxynitride, e.g., silicon oxide, silicon nitride, or silicon oxynitride. The active region 104 has conductivity and includes a typical channel region and/or a source/drain region. The active region 104 may include a region, which is doped with n-type impurities or p-type impurities. The plurality of bit lines 120, i.e., the first bit line pattern 120a, are disposed on the insulating layer 110. The plurality of bit lines 120 may be enclosed by a bit line capping layer 122 which is optionally formed to protect the plurality of bit lines 120. The first bit line expanding island pattern 130a is formed inside the insulating layer 110, a lower portion of the first bit line expanding island pattern 130a contacts the active region 104 of the semiconductor layer 100 to be electrically connected to the active region 104, and at least portion of an upper portion of the first bit line expanding island pattern 130a is electrically connected to one of the plurality of bit lines 120, i.e., the first bit line pattern 120a, The lower portion of the first bit line expanding island pattern 130a contacts a portion of the active region 104 and does not contact the isolation region 102; however, this is exemplary, and the inventive subject matter is not limited thereto. In other words, the first bit line expanding island pattern 130a may contact the whole portion of the active region 104 or may contact both the active region 104 and the isolation region 102. The upper portion of the first bit line expanding island pattern 130a contacts a portion of the first bit line pattern 120a; however, this is exemplary, and the inventive subject matter is not limited thereto. In other words, the upper portion of the first bit line expanding island pattern 130 may have an area enough to contact the whole portion of a lower portion of the first bit line pattern 120a or may have an area greater than the whole portion of a lower portion of the first bit line pattern 120a.

Figure 2B:
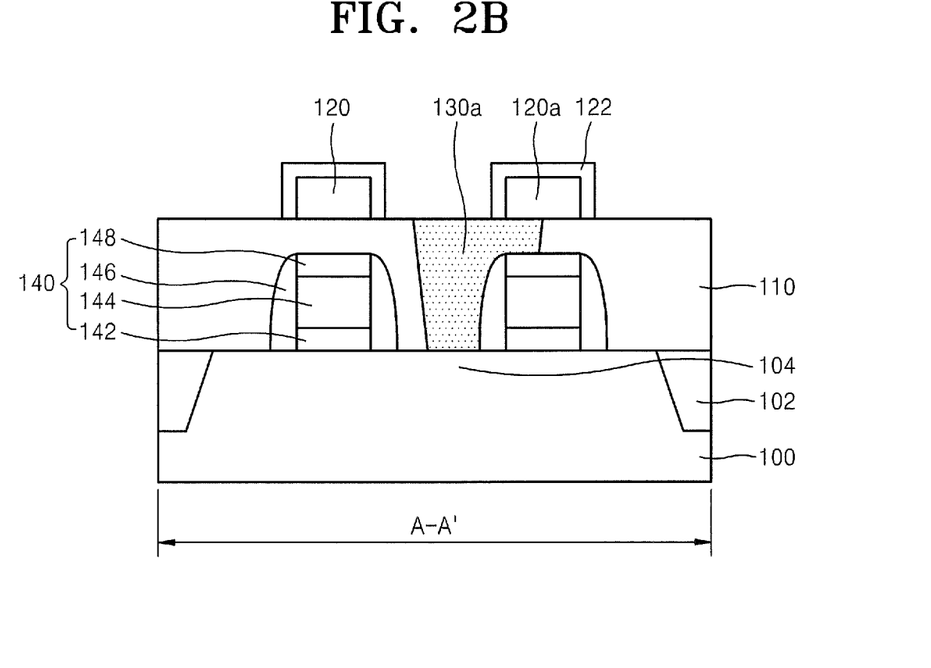

Referring to FIG. 2B, the semiconductor layer 100 includes the isolation region 102, the active region 104, and the insulating layer 110 formed on the isolation region 102 and the active region 104. The insulating layer 110 includes gate structures 140 each of which includes a gate insulating layer 142, a gate electrode 144, a spacer 146, and a capping layer 148. The gate structures 140 may be transistors, cell region transistors, or peripheral region transistors. The gate structures 140 may be transistors of a dynamic random access memory (DRAM) device, transistors of a static random access memory (SRAM) device, or transistors of a nonvolatile memory device. The plurality of bit lines 120, i.e., the first bit line pattern 120a, are disposed on the insulating layer 110. The first bit line expanding island pattern 130a is formed inside the insulating layer 110, the lower portion thereof contacts the active region 104 of the semiconductor layer 100 to be electrically connected to the active region 104, and the at least portion of the upper portion thereof is electrically connected to one of the plurality of bit lines 120, i.e., the first bit line pattern 120a. The first bit line expanding island pattern 130a contacts the active region 104 of the semiconductor layer 100 to be electrically connected to the active region 104 and simultaneously contacts the gate structure 140 formed on the active region 104 of the semiconductor layer 100. However, the first bit line expanding island pattern 130a may be electrically insulated from the gate structure 140 through the spacer 146 and the capping layer 148 of the gate structure 140.

Figure 2C:
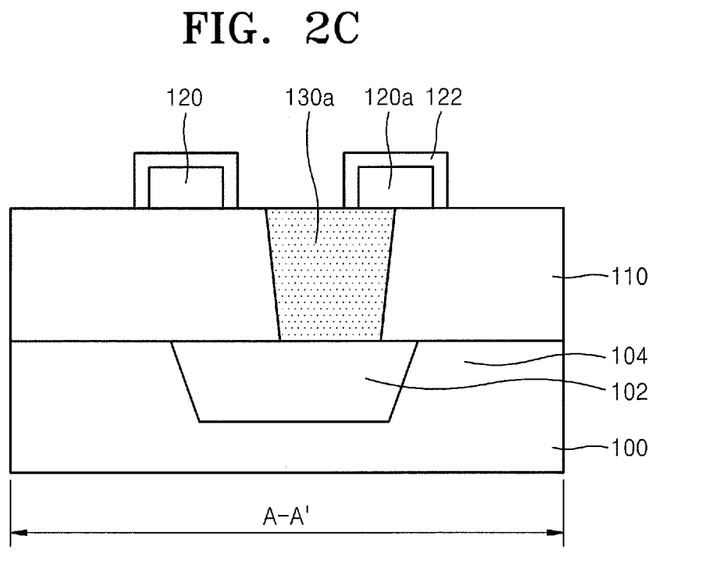

Referring to FIG. 2C, the semiconductor layer 100 includes the isolation region 102, the active region 104, and the insulating layer 110 formed on the isolation region 102, and the active region 104. The plurality of bit lines 120, i.e., the first bit line pattern 120a, is disposed on the insulating layer 110. The first bit line expanding island pattern 130a is formed inside the insulating layer 110, the lower portion of the first bit line expanding island pattern 130a contacts the isolation region 102 of the semiconductor layer 100, and the at least portion of the upper portion of the first bit line expanding island pattern 130a is electrically connected to one of the plurality of bit lines 120, i.e., the first bit line pattern 120a. Thus, the first bit line expanding island pattern 130 may be electrically insulated from the semiconductor layer 100 disposed underneath the isolation region 102 through the isolation region 102.

Figure 2D:
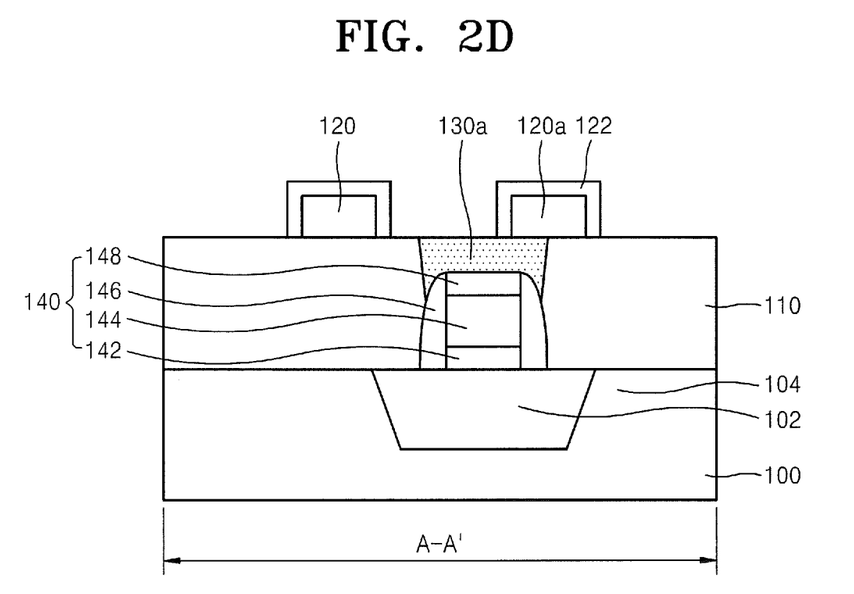

Referring to FIG. 2D, the semiconductor layer 100 includes the isolation region 102, the active region 104, and the insulating layer 110 formed on the isolation region 102 and the active region 104. The insulating layer 110 includes a gate structure 140 formed on the isolation region 102 of the semiconductor layer 100, and the plurality of bit lines 120, i.e., the first bit line pattern 120a, are disposed on the insulating layer 110. The first bit line expanding island pattern 130a is formed inside the insulating layer 110, the lower portion thereof contacts the gate structure 140 formed on the isolation region 102, and the at least portion of the upper portion thereof is electrically connected to one of the plurality of bit lines 120, i.e., the first bit line pattern 120a. The first bit line expanding island pattern 130a may be electrically insulated from the gate structure 140 through the spacer 146 and the capping layer 148 of the gate structure 140.

Here, the first bit line expanding island pattern 130a may be expanded to include at least two or more of the cross-sectional structures described with reference to FIGS. 2A through 2D.

Figure 3A:
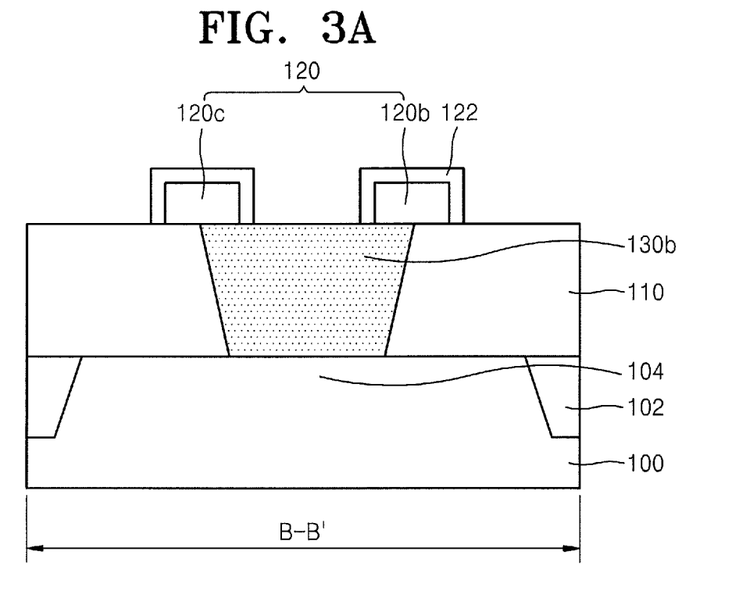
FIGS. 3A through 3D are cross-sectional views of the semiconductor device taken along a line B-B' of FIG. 1, according to some embodiments of the inventive subject matter.
Figure 3B:
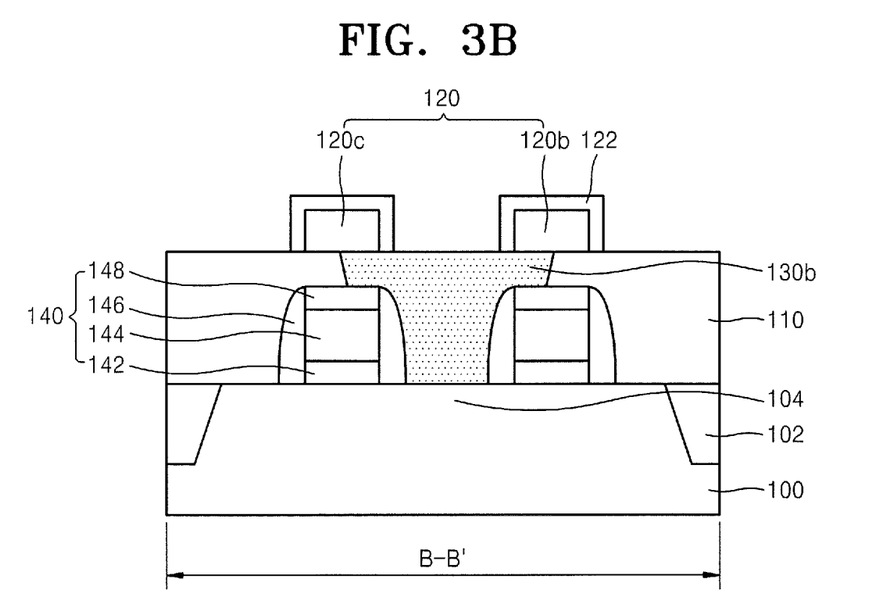
Figure 3C:
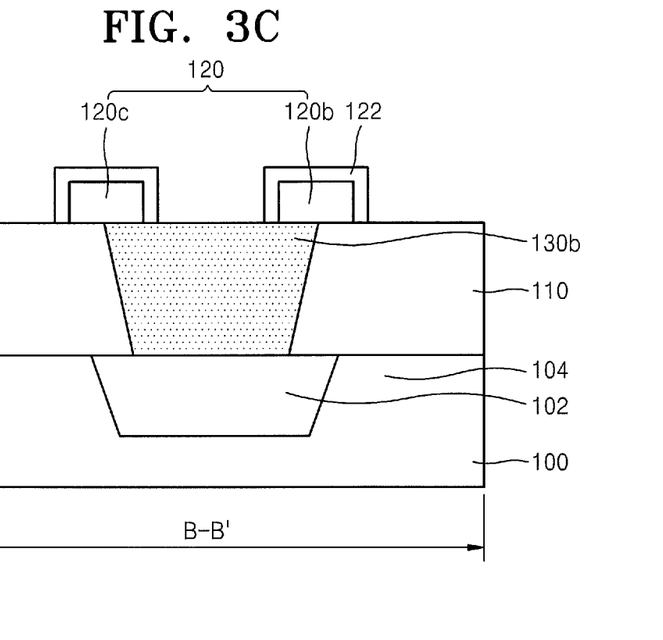
Figure 3D:
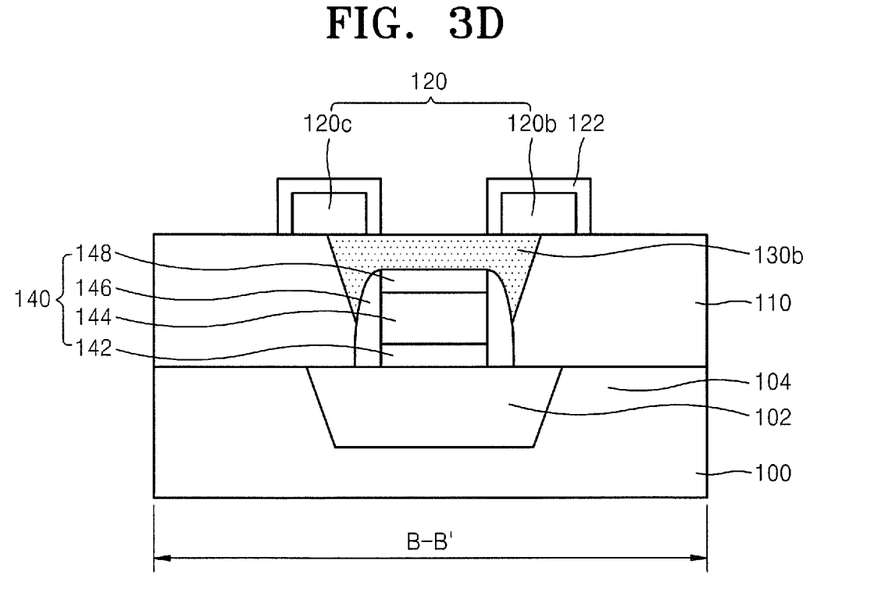

Referring to FIGS. 3A through 3d, the second bit line expanding island pattern 130b is similar to the first bit line expanding island pattern 130a described with reference to FIGS. 2A through 2D, except that the second bit line expanding island pattern 130b is electrically connected to the plurality of bit lines 120, i.e., the second and third bit line patterns 120b and 120c. In FIGS. 3A through 3D, the second bit line expanding island pattern 130b is electrically connected to two ones of the plurality of bit lines 120, i.e., the second and third bit line patterns 120b and 120c; however, this is exemplary, and the second bit line expanding island pattern 130b may be electrically connected to three or more ones of the plurality of bit lines 120. In FIGS. 3A and 3B, the second bit line expanding island pattern 130b is electrically connected to the active region 104. In FIGS. 3B and 3D, the second bit line expanding island pattern 130b may be electrically insulated from the gate structures 140 or the gate structure 140. In FIGS. 3C and 3D, the second bit line expanding island pattern 130b may be electrically insulated from the semiconductor layer 100 disposed underneath the isolation region 102 through the isolation region 102.

Here, the second bit line expanding island pattern 130b may be expanded to include at least two or more of the cross-sectional structures described with reference to FIGS. 3A through 3D.

Although not shown in FIGS. 2A through 3D, the bit line expanding islands 130 may be formed on a typical bit line contact plug (not shown) formed on the semiconductor layer 100. The bit line contact plug has a limited width due to a structure formed on the semiconductor layer 100. Thus, an electrical connection of the bit line contact plug to the plurality of bit lines 120 may be limited. However, if the bit line expanding islands 130 are formed on the bit line contact plug, the bit line expanding islands 130 may be formed on a greater region. Thus, electrical connections of the bit line expanding islands 130 to the plurality of bit lines 120 can be improved.

As described above, differently from a typical method of increasing widths of regions of the plurality of bit lines 120, the plurality of bit lines 120 may have uniform widths and may keep a uniform distance from one another due to the bit line expanding islands 130. Thus, the bit line expanding islands 130 can reduce defects occurring in the plurality of bit liens 120.

Figure 4:
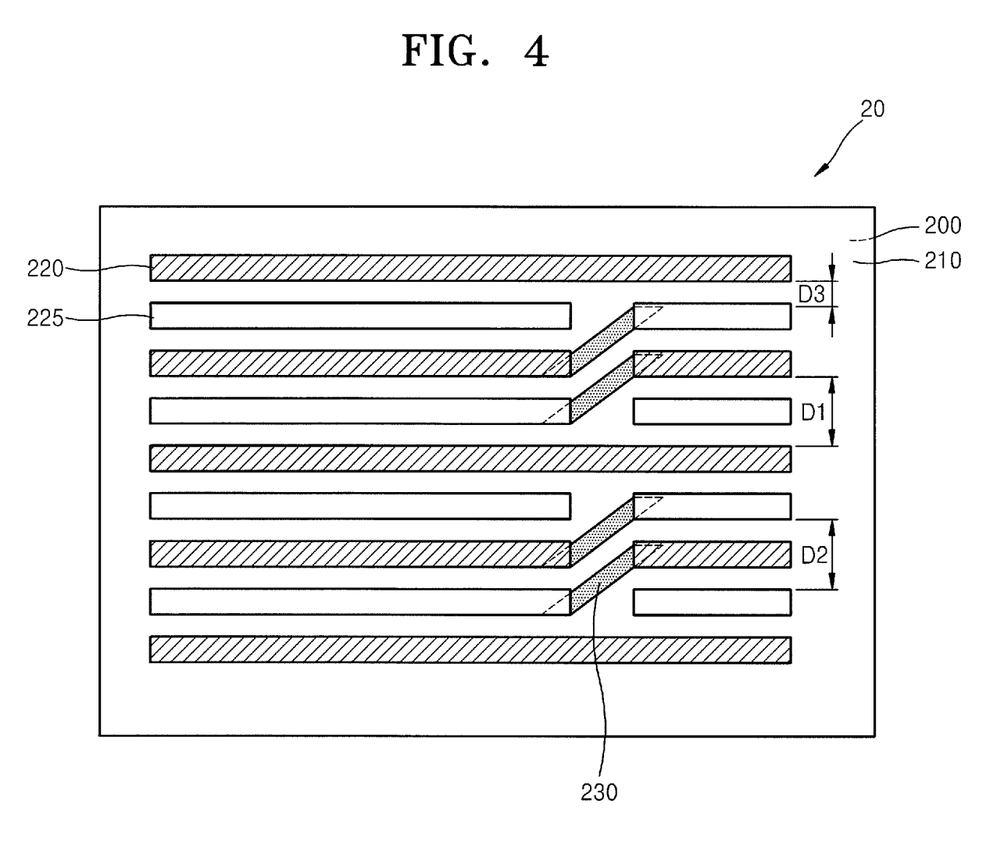
FIG. 4 is a plan view of a semiconductor device having bit line expanding islands according to some embodiments of the inventive subject matter.

FIG. 4 is a plan view of a semiconductor device 20 having bit line expanding islands according to some embodiments of the inventive subject matter.

Referring to FIG. 4, the semiconductor device 20 includes a semiconductor layer 200, an insulating layer 210 which is formed on the semiconductor layer 200, a plurality of first bit lines 220 and a plurality of second bit lines 225, which are formed on the insulating layer 210, and a plurality of bit line expanding islands 230, which are formed in a portion of the insulating layer 210 and electrically connect the plurality of first bit lines 220 to the plurality of second bit lines 225.

The plurality of first bit lines 220 keep a first distance "D1" from one another. The plurality of first bit lines 220 are expanded in a first direction. Some of the plurality of first bit lines 220 may be spaced apart from each another at a predetermined distance in the first direction. The plurality of second bit lines 225 keep a second distance "D2" from one another. The plurality of second bit lines 225 are expanded in the first direction. Some of the plurality of second bit lines 225 may be spaced apart from each another at a predetermined distance in the second direction. As will be described below, the plurality of bit line expanding islands 230 are formed within the predetermined distance.

The first distance "D1" may be equal to or different from the second distance "D2." The plurality of second bit lines 225 may be alternatively disposed among the plurality of first bit lines 220. The plurality of first bit lines 220 may keep a third distance "D3" from the plurality of second bit lines 225. The third distance "D3" may be less than the first distance "D1" and/or the second distance "D2."

The plurality of bit line expanding islands 2330 are formed in a portion of the insulating layer 210. An end portion of each of the plurality of bit line expanding islands 230 is disposed underneath a lower portion of one of the plurality of first bit lines 220 to be electrically connected to the first bit line 220, and an other end portion of each of the plurality of bit line expanding islands 230 is disposed underneath a lower portion of one of the plurality of second bit lines 225 to be electrically connected to the second bit line 225. Thus, some of the plurality of first bit lines 220 may be connected to some of the plurality of second bit lines 225 through the plurality of bit line expanding islands 230.

This embodiment may be applied to a case where bit lines are arrayed at a small distance, which cannot be realized in a resolution of a current technical standard photolithographic process, e.g., a resolution of a photolithographic process using light having a wavelength of about 176 nm. For example, the first distance "D1" and/or the second distance "D2" may be minimum pattern distances which can be realized in the resolution (hereinafter referred to as a minimum resolution) of the current technical level photolithographic process, and the third distance "D3" may be a pattern distance less than the minimum pattern distances. In this case, it is substantially impossible to simultaneously realize the plurality of first bit lines 220 and the plurality of second bit lines 225 in the same process, wherein the plurality of first bit lines 220 keep the third distance "D3" from the plurality of second bit lines 225. However, patterns, which are arrayed at a distance which cannot be realized in the minimum resolution, i.e., the third distance "D3," may be formed according to this embodiment.

In more detail, the plurality of bit line expanding islands 230 are first formed inside the insulating layer 210 to electrically connect the plurality of first bit lines 220 to the plurality of second bit lines 225. Next, the plurality of first bit lines 220, which keep the first distance "D1" from one another, are formed, and then the plurality of second bit lines 225, which keep the second distance "D2" from one another, are formed in an additional process. Thus, the plurality of first bit lines 220 and the plurality of second bit lines 225 may be formed, wherein the plurality of first bit lines 220 keep the third distance "D3" from the plurality of second bit lines 225 and are electrically connected to the plurality of second bit lines 225. The plurality of first bit lines 225 and the plurality of second bit lines 225 may or may not be formed on the same layer.

Figure 5:
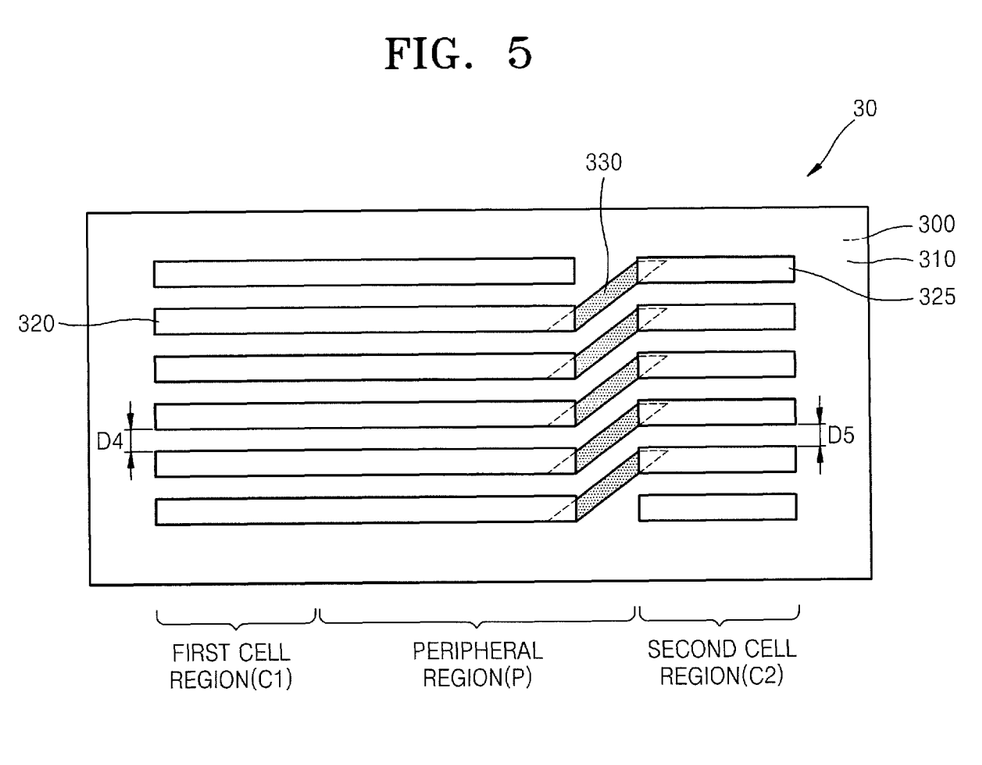
FIG. 5 is a plan view of a semiconductor device having bit line expanding islands according to some embodiments of the inventive subject matter.

FIG. 5 is a plan view of a semiconductor device 30 having bit line expanding islands according to some embodiments of the inventive subject matter.

Referring to FIG. 5, the semiconductor device 30 includes a semiconductor layer 300, an insulating layer 310, a plurality of third bit lines 320, a plurality of fourth bit lines 325, and a plurality of bit line expanding islands 330. A first cell region "C1," a peripheral region "P," and a second cell region "C2" are defined in the semiconductor layer 300. The insulating layer 310 is formed on the semiconductor layer 300. The plurality of third bit lines 320 and the plurality of fourth bit lines 325 are formed on the insulating layer 310. The plurality of bit line expanding islands 330 are formed inside the insulating layer 310 and electrically connect the plurality of third bit lines 320 to the plurality of fourth bit lines 325.

The plurality of third bit lines 320 are formed on the insulating layer 310 and expanded to the first cell region "C1" and the peripheral region "P." The plurality of third bit lines 320 keep a fourth distance "D4" from one another. The plurality of fourth bit lines 325 are formed on the insulating layer 310 and expanded to the second cell region "C2." The plurality of fourth bit lines 325 keep a fifth distance "D5" from one another. The fourth distance "D4" may be equal to or different from the fifth distance "D5."

The plurality of bit line expanding islands 330 are formed in a portion of the insulating layer 310. An end portion of each of the plurality of bit line expanding islands 330 is disposed underneath a lower portion of one of the plurality of third bit lines 320 to be electrically connected to the third bit line 320, and an other end portion of each of the plurality of bit line expanding islands 330 is disposed underneath a lower portion of one of the plurality of fourth bit lines 325 to be electrically connected to the fourth bit line 325. Thus, the plurality of third bit lines 320 are electrically connected to the plurality of fourth bit lines 325 through the plurality of bit line expanding islands 330.

This embodiment may be applied to a case where the plurality of third bit lines 320 expanding to the first cell region "C1" and the peripheral region "P" are electrically connected to the plurality of fourth bit lines 325 expanding to the second cell region "C2," and expanding directions of the plurality of third bit lines 320 are not equal to expanding directions of the plurality of fourth bit lines 325 or the expanding directions keep a predetermined distance in parallel.

The semiconductor devices 10, 20, and 30 according to the embodiments of the inventive subject matter may be DRAM devices, SRAM devices, or nonvolatile memory devices. However, this is exemplary, and the inventive subject matter is not limited thereto.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

That which is claimed:

1. A semiconductor device, comprising:
   a semiconductor layer in which an isolation region and an active region are defined;
   an insulating layer formed on the semiconductor layer;
   a plurality of bit lines formed on the insulating layer; and
   a bit line expanding island formed inside the insulating layer, which is electrically connected to a lower portion of at least one bit line of the plurality of bit lines;
   wherein the bit line expanding island physically connects at least two bit lines of the plurality of bit lines.

2. The semiconductor device of claim 1, wherein the plurality of bit lines have substantially equal widths, keep a predetermined distance from one another, and are expanded in a first direction.

3. The semiconductor device of claim 1, wherein the plurality of bit lines are expanded in a first direction, and the bit line expanding island is expanded in a second direction crossing the first direction.

4. The semiconductor device of claim 1, wherein the bit line expanding island and the plurality of bit lines comprise a same material.

5. The semiconductor device of claim 1, wherein the bit line expanding island and the plurality of bit lines comprise different materials.

6. The semiconductor device of claim 1, wherein the bit line expanding island is disposed on the active region of the semiconductor layer and is electrically connected to the active region.

7. The semiconductor device of claim 1, wherein the bit line expanding island is disposed on the isolation region of the semiconductor layer and is electrically insulated from the semiconductor layer disposed underneath the isolation region.

8. The semiconductor device of claim 1, wherein the bit line expanding island is disposed on a gate structure formed on the active region of the semiconductor layer.

* * * * *